(12) United States Patent
Goldman et al.

(10) Patent No.: US 11,919,235 B2
(45) Date of Patent: Mar. 5, 2024

(54) TECHNIQUES FOR GENERATION AND DIRECTION OF LIGHT IN ADDITIVE FABRICATION AND RELATED SYSTEMS AND METHODS

(71) Applicant: Formlabs, Inc., Somerville, MA (US)

(72) Inventors: Andrew M. Goldman, Stow, MA (US); Benjamin FrantzDale, Harvard, MA (US); Scott Norton, Cary, NC (US)

(73) Assignee: Formlabs, Inc., Somerville, MA (US)

( * ) Notice: Subject to any disclaimer, the term of this patent is extended or adjusted under 35 U.S.C. 154(b) by 0 days.

(21) Appl. No.: 17/540,592

(22) Filed: Dec. 2, 2021

(65) Prior Publication Data

US 2022/0194003 A1 Jun. 23, 2022

Related U.S. Application Data

(60) Provisional application No. 63/120,797, filed on Dec. 3, 2020.

(51) Int. Cl.
| | |
|---|---|
| *B29C 64/277* | (2017.01) |
| *B29C 64/255* | (2017.01) |
| *B29C 64/268* | (2017.01) |
| *B33Y 30/00* | (2015.01) |
| *H01S 5/42* | (2006.01) |

(52) U.S. Cl.
CPC .......... *B29C 64/277* (2017.08); *B29C 64/255* (2017.08); *B29C 64/268* (2017.08); *B33Y 30/00* (2014.12); *H01S 5/423* (2013.01)

(58) Field of Classification Search
CPC ... B29C 64/264; B29C 64/268; B29C 64/277; B29C 64/282; B29C 64/286; B29C 64/291
See application file for complete search history.

(56) References Cited

U.S. PATENT DOCUMENTS

| | | | | |
|---|---|---|---|---|
| 2014/0052288 | A1* | 2/2014 | El-Siblani | B29C 64/264 700/119 |
| 2018/0281278 | A1* | 10/2018 | George | H01S 5/18355 |
| 2019/0152135 | A1* | 5/2019 | Goldman | B29C 64/268 |
| 2020/0039143 | A1* | 2/2020 | Turner | B29C 64/255 |
| 2020/0094469 | A1* | 3/2020 | Holt | B29C 64/232 |

\* cited by examiner

*Primary Examiner* — Joseph S Del Sole
*Assistant Examiner* — Jamel M Nelson
(74) *Attorney, Agent, or Firm* — Wolf, Greenfield & Sacks, P.C.

(57) ABSTRACT

According to some aspects, techniques that address one or more drawbacks of laser-based optical systems in additive fabrication devices are described. In some aspects, an additive fabrication device may include one or more variable focus lenses that may be operated (e.g., actuated) during fabrication to adjust the focus, and thereby the spot size, of a laser beam. In some aspects, an additive fabrication device may comprise a laser array, such as a plurality of vertical-cavity surface-emitting lasers (VCSELs), that may be operated to direct light into a build region, rather than using a single laser beam, such as a single diode laser. In some aspects, an additive fabrication device may comprise a container that includes a flexible display film, such as a flexible LCD screen, which may be operated to direct light into the container to thereby cure a liquid photopolymer therein.

15 Claims, 13 Drawing Sheets

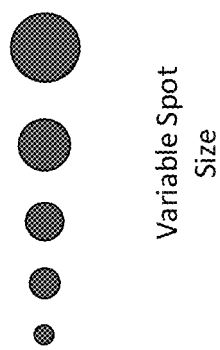
FIG. 3B
Fixed Spot Size
Variable Spot Size
FIG. 3C
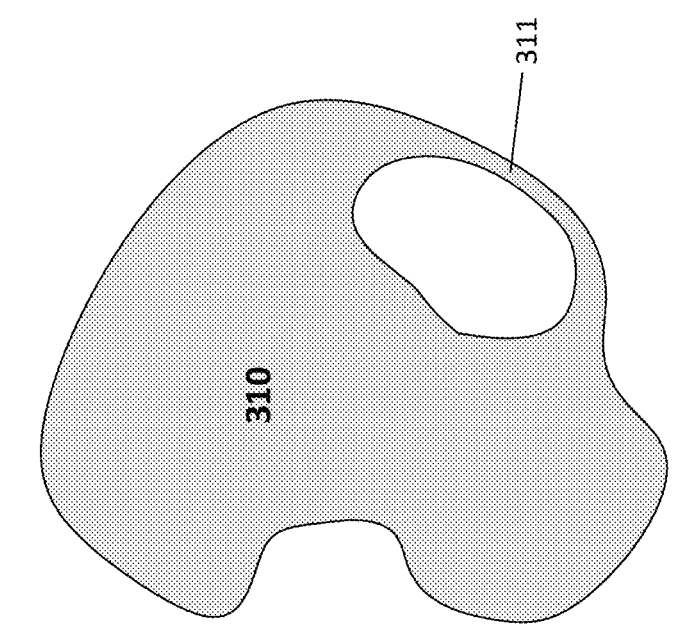
FIG. 3A

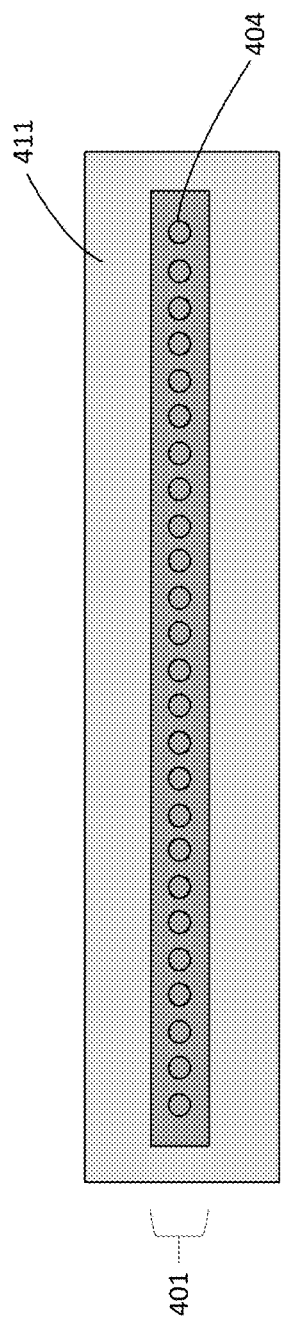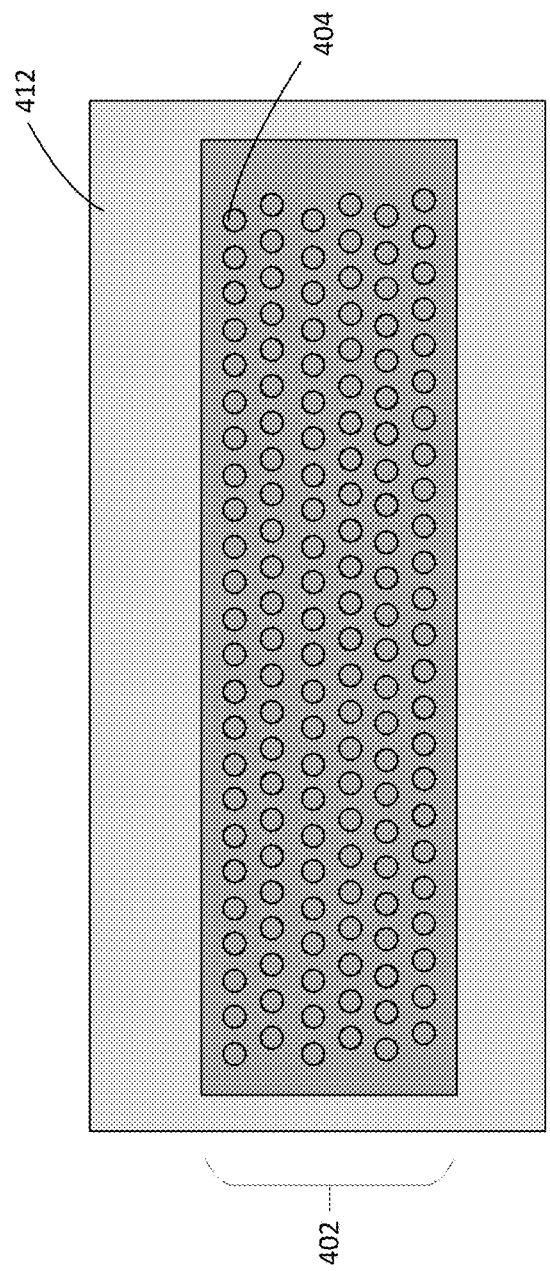
FIG. 4A
FIG. 4B

TECHNIQUES FOR GENERATION AND DIRECTION OF LIGHT IN ADDITIVE FABRICATION AND RELATED SYSTEMS AND METHODS

CROSS-REFERENCE TO RELATED APPLICATIONS

The present application claims the benefit under 35 U.S.C. § 119(e) of U.S. Provisional Patent Application No. 63/120,797, filed Dec. 3, 2020, titled "Techniques for Generation And Direction of Light in Additive Fabrication and Related Systems and Methods," which is hereby incorporated by reference in its entirety.

BACKGROUND

Additive fabrication, e.g., 3-dimensional (3D) printing, provides techniques for fabricating objects, typically by causing portions of a building material to solidify at specific locations. Additive fabrication techniques may include stereolithography, selective or fused deposition modeling, direct composite manufacturing, laminated object manufacturing, selective phase area deposition, multi-phase jet solidification, ballistic particle manufacturing, particle deposition, laser sintering or combinations thereof. Many additive fabrication techniques build parts by forming successive layers, which are typically cross-sections of the desired object. Typically each layer is formed such that it adheres to either a previously formed layer or a substrate upon which the object is built.

SUMMARY

An additive fabrication device comprising a build platform with a build surface for forming an object thereon, wherein the build platform is configured to move in a vertical direction relative to the additive fabrication device, a container for holding liquid photopolymer that is polymerizable on exposure to radiation, the container comprising an interior bottom surface, sides connected to the bottom surface, and a flexible display film extended between the sides of the container, wherein the flexible display film is configured to emit radiation to cure selected portions of the liquid photopolymer in the container, and at least one controller configured to operate the flexible display film to emit said radiation from selected regions of the flexible display film to cure the selected portions of the liquid photopolymer and thereby form a layer of cured liquid photopolymer in contact with the interior bottom surface of the container and the build surface of the build platform and/or a previously formed layer of cured liquid photopolymer.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 3A-3C illustrate formation of a layer of a part using a single fixed spot size of light or a variable spot size of light, according to some embodiments;

FIGS. 4A and 4B illustrate examples of a VCSEL array, according to some embodiments;

DETAILED DESCRIPTION

Figure 1:
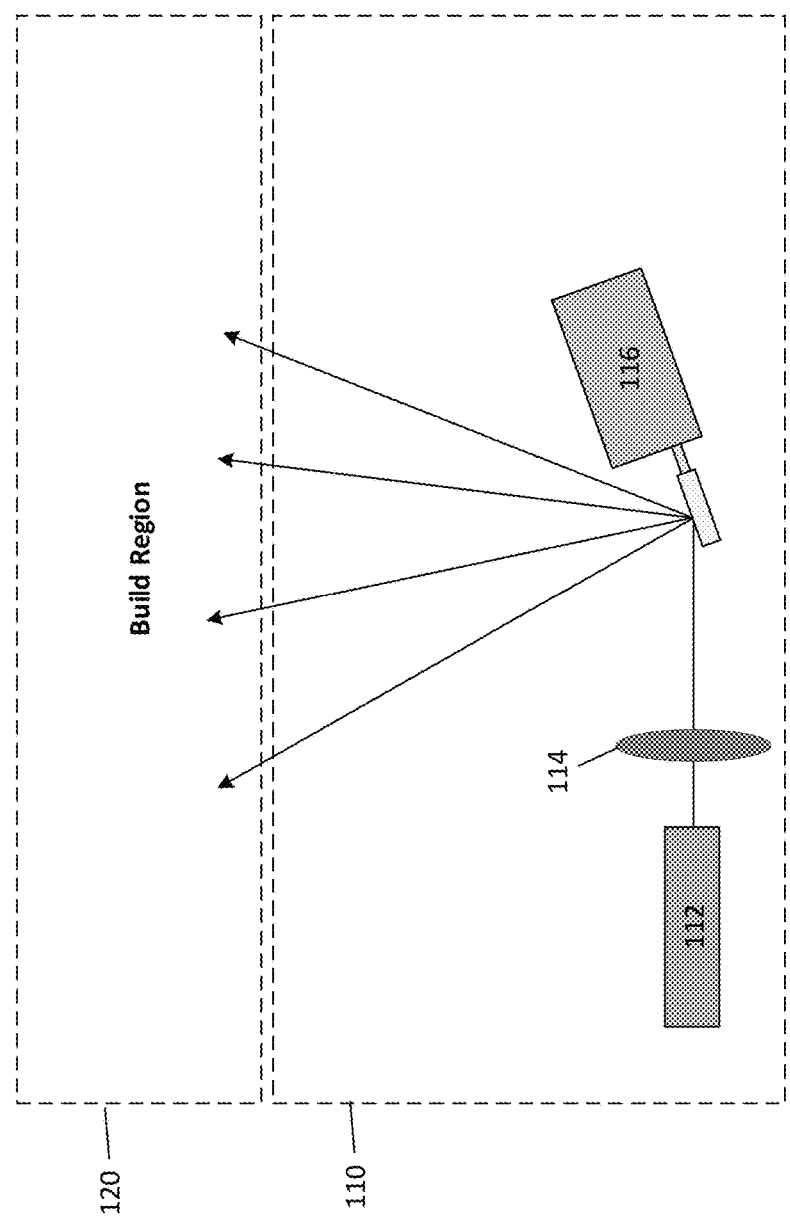
FIG. 1 illustrates a schematic of an additive fabrication device comprising a light system that includes a variable focus lens, according to some embodiments.

A number of additive fabrication techniques utilize sources of directed energy such as lasers to form solid material. For instance, in one approach to additive fabrication, known as stereolithography (SLA), solid objects are created by successively forming thin layers of a curable polymer resin, typically first onto a substrate and then one on top of another. Exposure to actinic radiation cures a thin layer of liquid resin, which causes it to harden and adhere to previously cured layers or the bottom surface of the build platform. The source of actinic radiation in stereolithography is often a laser. Another additive fabrication technique Selective Laser Sintering (SLS), forms objects by fusing fine material, such as one or more powders, together into larger solid masses. This process of fusing fine material typically occurs by directing sufficient energy (e.g., heat and/or light) to the material to cause consolidation. Often at least part of this energy is applied with a laser.

A laser beam, when coupled to suitable optics for directing the beam, represents a highly controllable and bright source of light suitable for many additive fabrication techniques, including those described above. Such a laser system can suffer from a number of drawbacks, however. First, a laser system is generally limited to a fixed spot size in that the diameter of the laser beam when it is incident on a source material (e.g., a liquid photopolymer in SLA, or a powder in SLS) is generally fixed. As a result, the spot size is usually selected based on the smallest desired features to be formed—yet this can mean other larger features need to also be formed from the same beam and which thereby take much longer to form than the small feature.

Second, a laser system requires optical components such as controllable mirrors (e.g., mirror galvanometers) to direct the laser beam to a desired location. These components can require careful initial calibration and, in some cases, additional calibration during the life of the system due to the mechanical components drifting over time. Third, the optical components can introduce distortions or other optical aberrations in the beam, such as field-dependent distortions.

The inventors have recognized and appreciated techniques that each address one or more of the above-described drawbacks of laser-based optical systems in additive fabrication devices. In some aspects, an additive fabrication device may include one or more variable focus lenses that may be operated (e.g., actuated) during fabrication to adjust the focus, and thereby the spot size, of a laser beam. In some aspects, an additive fabrication device may comprise a laser array, such as a plurality of vertical-cavity surface-emitting lasers (VCSELs), that may be operated to direct light into a build region, rather than using a single laser beam, such as a single diode laser. In some aspects, an additive fabrication device may comprise a container that includes a flexible display film, such as a flexible LCD screen, which may be operated to direct light into the container to thereby cure a liquid photopolymer therein.

FIG. 1 illustrates a schematic of an additive fabrication device comprising a light system that includes a variable focus lens, according to some embodiments. In the example of FIG. 1, light system 110 includes a light source 112, a variable focus lens 114 that is configured to produce varying focal lengths (thus producing light with different spot sizes on a curing plane in the build region 120), and optical component 116, which is configured to be operable to direct light into a build region 120. According to some embodiments, optical component 116 may comprise one or more mirror galvanometers and/or other mirrors and/or lenses. According to some embodiments, light source 112 may comprise a laser, such as a He—Ne laser or a diode laser.

The build region 120 may be a region in the additive fabrication device 100 that comprises a source material from which parts are formed, and directing the light from light system 110 into the build region may cause formation of solid material from the source material. The particular process by which this occurs depends on the additive fabrication technology being employed in the device 100. Examples of implementations of the light system 110 within a particular additive fabrication technology are described below in relation to FIGS. 2A and 2B, but the approach of FIG. 1 should not be viewed as being limited to either of these illustrative implementations.

Variable focus lens 114 may include any optical component or components that may be operated to vary the focal length of light so produced. For instance, the curvature of the variable focus lens may be adjusted in response to a control signal being applied to the variable focus lens. As a result of the varied focal lengths, light generated from the light source 112 will have different spot sizes on a curing plane (usually occupying a bottom layer of the build region 120). For example, when the curing plane is exactly at the focal point of the variable focus length 114, the spot size is at its minimum.

In some embodiments, variable focus lens 114 may be configured as an electro-optical lens such that applying or adjusting an electrical potential within or across the lens may change the shape of the lens and/or the way in which light is refracted by the lens, thereby changing the focal length of light produced by the lens. For instance, variable focus lens 114 may comprise a layer of liquid crystal. By applying or otherwise varying a voltage across the liquid crystal layer, the index of refraction of the layer may be adjusted. In some embodiments, the variable focus lens 114 may comprise a liquid-filled chamber with at least part of the chamber walls including a dielectric elastomer. By adjusting the electric potential across the elastomer, a large strain may be produced, thereby changing the shape of the chamber and altering how light is refracted by passing through the chamber.

According to some embodiments, variable focus lens 114 may comprise a flexure mechanism in which one or more piezoelectric actuators may be coupled to a solid material such as glass, which may form part of a lens. By adjusting the electric potential across a piezoelectric actuator, the solid material may be deformed. In some cases, a stack of piezoelectric actuators may be coupled to the solid material to produce sufficient deformation of the solid material to control the focal length of the lens.

According to some embodiments, variable focus lens 114 may be operated through electrowetting, in which an electric field applied to a surface causes a change in the wettability of the surface (how hydrophobic or hydrophilic the surface is). By adjusting the wettability of the surface and arranging a liquid on the surface, the refractive behavior of the surface may be adjusted. In some cases, the variable focus lens 114 may comprise two liquids adjacent to one another, and may be operated so that an applied voltage adjusts the shape of the interface between the liquids, thereby altering the refractive behavior of the liquids.

In some embodiments, device 100 may include one or more additional lenses other than the variable focus lens(es) 114. For instance, device 100 may comprise a static (non-variable) lens in addition to a variable focus lens. In some embodiments, device 100 may be configured to move lenses, whether variable focus lenses or static lenses, in and out of the optical path of the light from light source 112. For instance, device 100 may comprise a static lens in addition to a variable focus lens, and may be configured to move each of the two lenses in and out of the optical path so that light from the light source 112 passes through only one of the two lenses, or passes through both lenses, depending on the position of each lens.

In some embodiments, device 100 may include one or more polarization control elements, such as adjustable polarizers and/or adjustable wave-plates. Such elements may be actuatable by device 100 to adjust the polarization state of light emitted by the light source 112 and/or by the variable focus lens 114 (or indeed, the light at any point along its path within device 100). For instance, the light emitted by the light source 112 may have an astigmatism such that the focus is different within two different planes of the light (e.g., different foci in the tangential and sagittal planes). A polarization control element arranged at the output of the light source 112 may be configured to correct or otherwise adjust this astigmatism (e.g., so that the focus of the light is the same within different planes of the light). In some cases, the polarization control element may be actuatable so that the polarization of the light produced can be adjusted by the device 100.

In some embodiments, the focal length of the lens may be simultaneously actuated with the galvanometer of the optical component 116 in such a way as to produce light having a constant spot size (e.g., cross-sectional beam size) within the build region 120. For example, when the optical component 116 is operated to direct light to the build region, the change in optical path from the optical component to build region means that light produced in the build region may have a range of spot sizes and/or shapes. However, by varying the focal length through suitable operation of the lens 114 in concert with operation of the optical component 116, variation in size and/or shape of the spot of the light may be mitigated or eliminated.

Figure 2A:
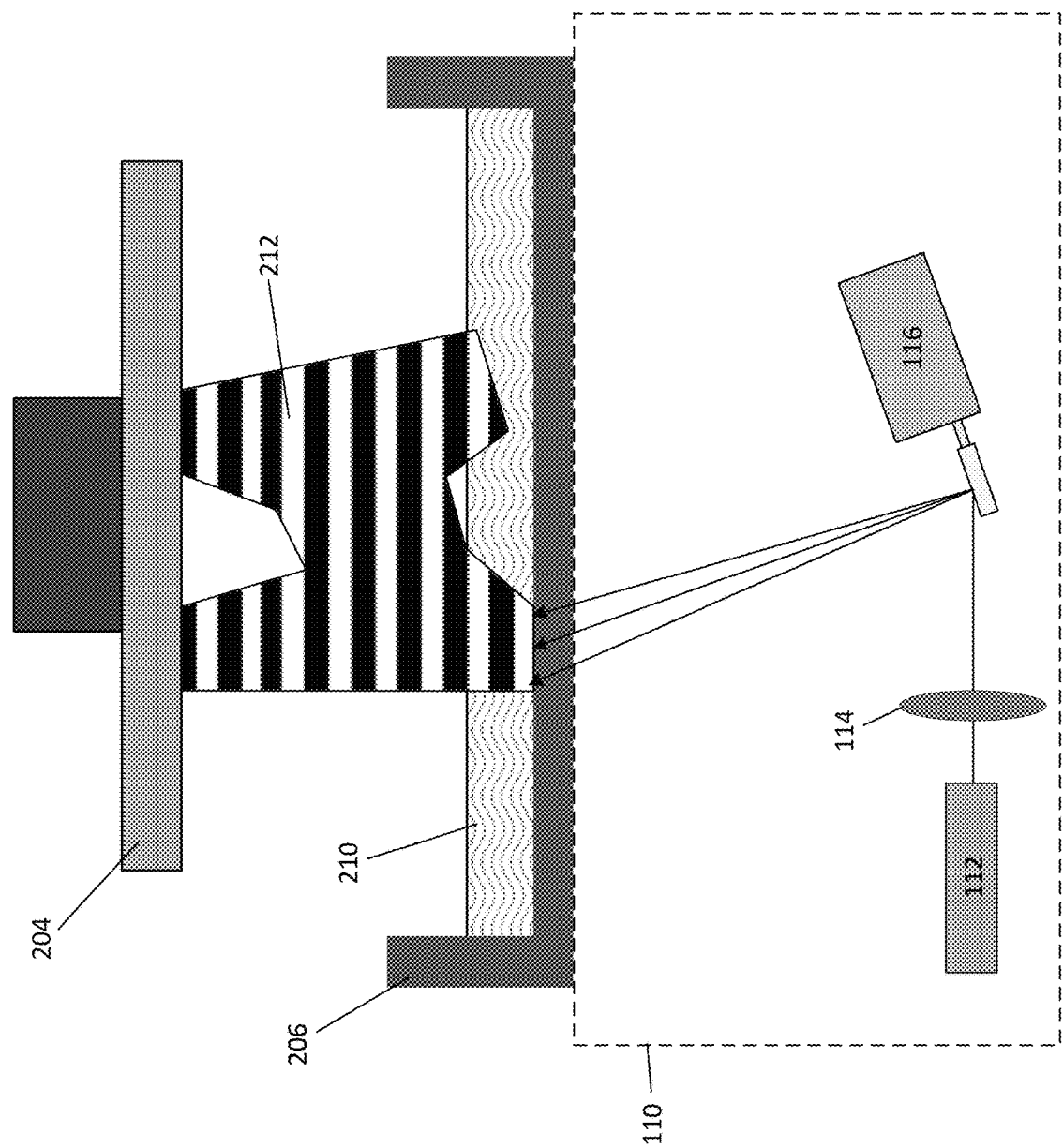
FIG. 2A depicts the light system of FIG. 1 arranged within a stereolithographic additive fabrication device, according to some embodiments.

FIG. 2A depicts the light system of FIG. 1 arranged within a stereolithographic additive fabrication device, according to some embodiments. In the example of FIG. 2A, light system 110 shown in FIG. 1 and described above is arranged beneath a container 206 which holds a liquid photopolymer 210. For purposes of illustration, a part 212 is being formed on build platform 204 by directing light from the light system 110 through the container 206 and into the liquid photopolymer.

In FIG. 2A, the layers of the part 212 are each formed from the same material but are shown in alternating shades merely to visually distinguish them in this example. The container's base surface may be transparent to the radiation produced by light source 112, such that radiation can be targeted at portions of the thin layer of liquid photocurable photopolymer resting on the base surface of the container. Exposure to actinic radiation cures a thin layer of the liquid photopolymer, which causes it to harden. A newly formed layer may be at least partially in contact with both a previously formed layer and the surface of the container 206 when it is formed. The top side of the cured photopolymer layer typically bonds to either the bottom surface of the build platform 204 or with the previously cured photopolymer layer in addition to the transparent floor of the container. In order to form additional layers of the part, any bonding that occurs between the transparent floor of the container and the layer must be broken. For example, one or more portions of the surface (or the entire surface) of the new layer may adhere to the container such that the adhesion must be removed prior to formation of a subsequent layer. In some embodiments, the new layer may be separated from the container via some relative motion of the container and part 212, such as sliding the container, rotating the container, moving the build platform away from the container, or combinations thereof.

Figure 2B:
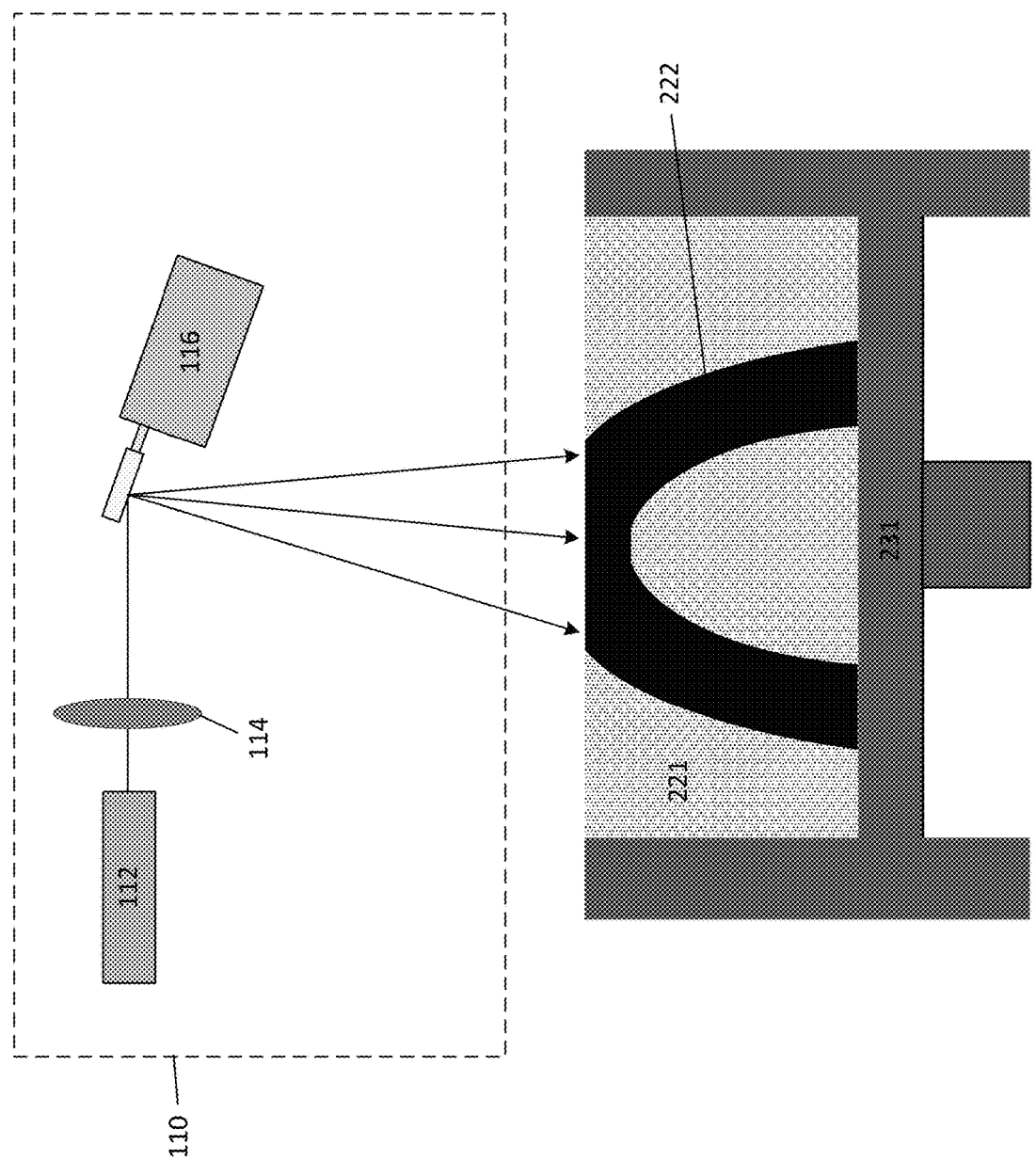
FIG. 2B depicts the light system of FIG. 1 arranged within a selective laser sintering additive fabrication device, according to some embodiments.

FIG. 2B depicts the light system of FIG. 1 arranged within a selective laser sintering additive fabrication device, according to some embodiments. As shown in FIG. 2B, the light system 110 is arranged to direct light down onto the surface of a powder bed 221 to form a part 222. In the example of FIG. 2B, powder in the uppermost layer of the powder bed 221 may be maintained at an elevated temperature, low enough to minimize thermal degradation, but high enough to require minimal additional energy exposure to trigger consolidation. Energy from the light system 110 is then applied to selected areas to cause consolidation.

In the example of FIG. 2B, the material in the fabrication bed 221 may be selectively heated by the light from light system 110 in a manner that causes the powder material particles to fuse (sometimes also referred to as "sintering" or "consolidating") such that a new layer of the object 222 is formed. According to some embodiments, suitable powdered materials may include any of various forms of powdered, meltable materials, such as a nylon powder. Once a layer has been successfully formed, the fabrication platform 231 may be lowered a predetermined distance by a motion system (not pictured in FIG. 2B). Once the fabrication platform 231 has been lowered, a material deposition mechanism may be moved across the fabrication bed 221, spreading a fresh layer of material across the fabrication bed to be consolidated as described above. Mechanisms configured to apply a consistent layer of material onto the fabrication bed may include the use of wipers, rollers, blades, and/or other levelling mechanisms for moving material from a source of fresh material to a target location.

Since material in the powder bed 221 is typically only consolidated in certain locations by the laser, some material will generally remain within the bed in an unconsolidated state. This unconsolidated material is sometimes referred to as the part cake. In some embodiments, the part cake may be used to physically support features such as overhangs and thin walls during the formation process, allowing for SLS systems to avoid the use of temporary mechanical support structures, such as may be used in other additive manufacturing techniques such as stereolithography. In addition, this may further allow parts with more complicated geometries, such as moveable joints or other isolated features, to be printed with interlocking but unconnected components.

The above-described process of producing a fresh layer of powder and consolidating material using the laser repeats to form an object layer-by-layer until the entire object has been fabricated. Once the object has been fully formed, the object and the part cake may be cooled at a controlled rate so as to limit issues that may arise with fast cooling, such as warping or other distortion due to variable rate cooling. The object and part cake may be cooled while within the selective laser sintering apparatus, or removed from the apparatus after fabrication to continue cooling. Once fully cooled, the object can be separated from the part cake by a variety of methods. The unused material in the part cake may optionally be recycled for use in subsequent prints.

In each of the examples of FIGS. 2A and 2B, the light system 110 may be configured to operatively aim light from the light source 112 into the build region and move over the area corresponding to a given cross-sectional area of a computer aided design (CAD) model representing a desired part. Suitable scanning systems may include one or more mechanical gantries, linear scanning devices using polygonal mirrors, and/or galvanometer-based scanning devices. By also adjusting the focal length of the beam of light produced by the light source by operating the variable focus lens 114 as discussed above, various advantages may be recognized.

For purposes of illustration, FIG. 3A depicts a layer 310 of a part to be fabricated. With a laser having a fixed spot size, as depicted in FIG. 3B, the fixed spot size may need to be small enough to produce small details, such as the region 311 in layer 310. However, the same spot size may then also be used to fill in the remaining area of layer 310, which may be time intensive.

The above-described light system 110 that includes a variable focus lens may, however, allow for the production of a range of spot sizes, examples of which are depicted in FIG. 3C. Since the build region does not move relative to the light system 110 (or at least the beam path length from the light source 112 to the build region remains substantially constant), adjusting the focal length of the light produced by the light system will also adjust the spot size and/or shape of the light beam that is incident on the build region. As a result, the various spot sizes depicted in the example of FIG. 3C may be produced from the light system 110 by adjusting the focal length of the variable focus lens 114 as described above. As may be noted, being able to adjust the spot size of the beam may allow for curing layer 310 more quickly than in the case of a fixed spot size. For instance, a smaller spot size may be produced to cure the smaller region 311 and a larger spot size may be produced to cure the bulk of the remainder of layer 310. In this manner, the layer 310 may be cured more quickly by adapting the spot size through adjustment of the variable focus lens.

According to some embodiments, one strategy for curing a layer may comprise curing the perimeter of the layer with a comparatively small spot size, then curing at least some of the interior of the layer with a comparatively large spot size.

According to some embodiments, adjusting the spot size of the light from the light source may be adjusted along with the power of the light. For instance, for a laser beam the power of the laser may be adjusted while the focal length produced from the variable focus lens is adjusted such that the power density of light within the spot produced in the build region remains substantially constant. For example, the power of the laser may be increased with the power scaling as the square of the diameter of the spot size. Alternatively, the power of the laser may remain constant but the curing time (per unit area) with using a larger spot size may be increased to achieve uniform curing across the curing plane.

According to some embodiments, the spot shape of the light may be adjusted in addition to, or as an alternative to, adjusting the spot size of the light. As discussed above, in some cases an additive fabrication device may comprise one or more polarization elements that may be adjusted to alter the polarization state of light. By adjusting such elements, the shape of the spot of light when incident upon the source material may be altered. For instance, the ellipticity of the spot may be increased or decreased based on the shape of an area to be cured.

As discussed above, an additive fabrication device may comprise an array of lasers, such as a plurality of vertical-cavity surface-emitting lasers (VCSELs), that may be operated to direct light into a build region, rather than using a single laser beam. The below discussion may be generally applied to any suitable array of lasers, although VCSELs may have a number of advantages when used in a laser array of an additive fabrication device. VCSELs generally produce a low divergence beam suitable for additive fabrication, and many may be fabricated on a single wafer to produce a one-dimensional or two-dimensional array of VCSELs, which may be operated as a single light source to utilize the combined emission of the array. In some cases, a VCSEL array can contain hundreds or even thousands of emitters.

FIGS. 4A and 4B illustrate examples of a VCSEL array, according to some embodiments. In the example of FIG. 4A, a one-dimensional array 401 of VCSELs 404 is depicted on a substrate 411. In the example of FIG. 4B, a two-dimensional array 402 of VCSELs 404 is depicted on a substrate 412. While a particular arrangement of VCSELs is shown in FIGS. 4A and 4B it will be appreciated that any suitable geometrical arrangement of VCSELs on a substrate may be utilized.

An array of VCSELs may be operated as a light source in an additive fabrication device. For instance, an SLA device or an SLS device may include an array of VCSELs in place of a single laser. In some embodiments, light source 112 shown in FIGS. 1, 2A and 2B may comprise an array of VCSELs. In these cases, the VCSEL array may be operated as a single source of light where the combined emission of the VCSELs is used as the single source.

The VCSELs shown in FIGS. 4A and 4B may produce light at any desired wavelength or wavelengths. In some embodiments, at least some of the VCSELs produce light in the ultraviolet spectrum (e.g., a wavelength between 10 nm and 400 nm). In some embodiments, at least some of the VCSELs produce light in the infrared spectrum (e.g., a wavelength between 700 nm and 1 mm). In some embodiments, at least some of the VCSELs may be multimode VCSELs.

Alternatively, an array of VCSELs may be operated as a moveable light source in an additive fabrication device, wherein the VCSELs extend along a first axis and may be moved along a second axis perpendicular to the first axis. In this configuration, a portion of the VCSELs may be illuminated to direct light onto selected portions of a strip of a build region. By turning selected VCSELs on and off as the VCSELs move along the second axis, light may be directed to selected portions of the build region.

Figure 5:
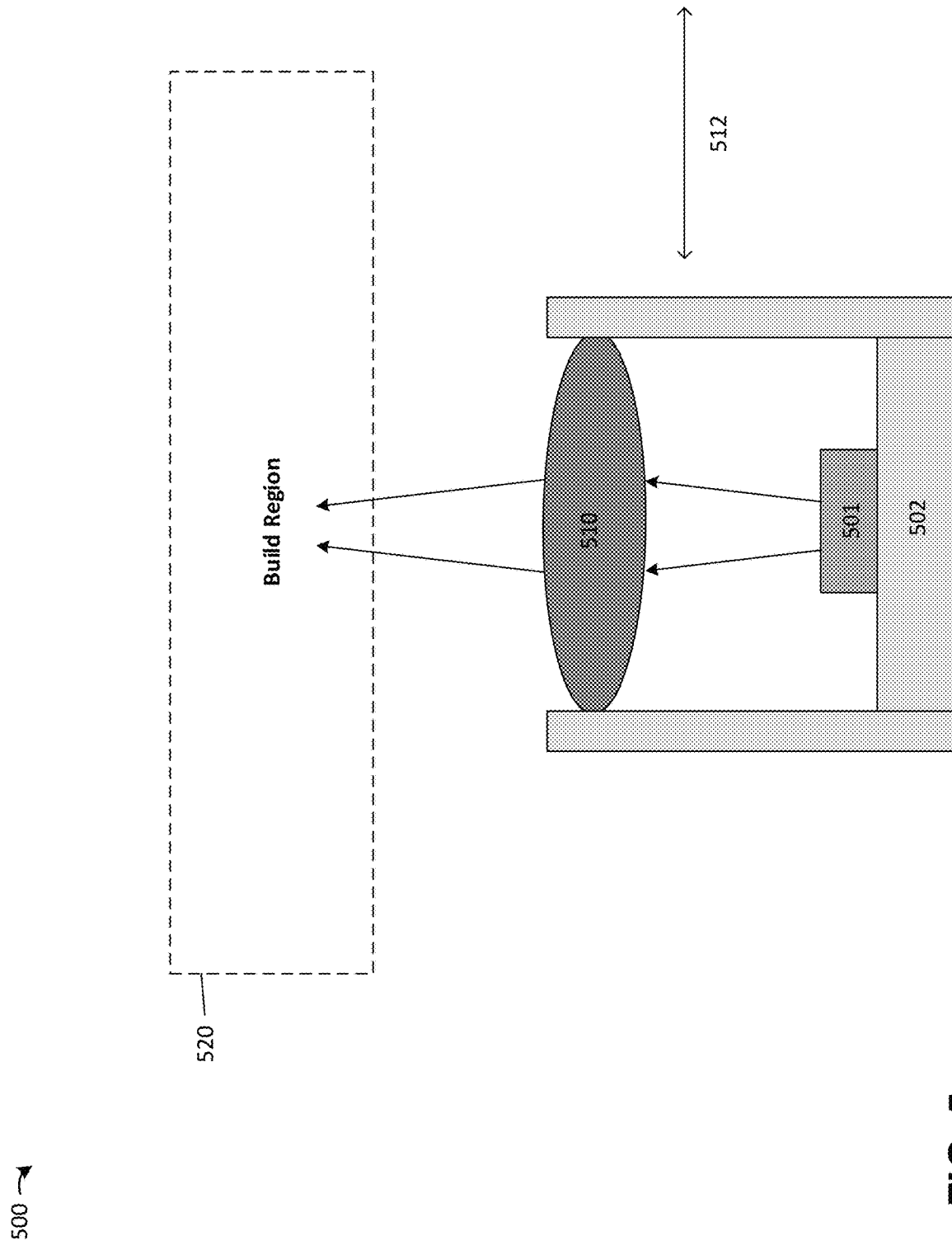
FIG. 5 depicts an additive fabrication device comprising a movable stage including a VCSEL array, according to some embodiments.

FIG. 5 depicts an example of such a configuration in which an array of VCSELs 501 are arranged on a movable stage 502, which may be operated to move along axis 512. The array of VCSELs extend into the page in the example of FIG. 5, so that as the VCSEL array moves along axis 512, light may be directed onto selected portions of the build region 520. Lens 510 focuses light from the VCSEL array 501.

As discussed above, an additive fabrication device may comprise a container that includes a flexible display film, such as a flexible LCD display, flexible micro-LED display, or a flexible OLED display, which may be operated to direct light into the container to thereby cure a liquid photopolymer therein. Such a screen may be operated by illuminating selected pixels of the display to illuminate corresponding regions within the container. In some embodiments, the additive fabrication device may include a movable stage comprising rollers, sliders, or other structures that produce a flat portion of the film above the movable stage. As the movable stage moves across the underside of the container, portions of the display film may be illuminated within the flat portion of the film to cure regions of the liquid photopolymer directly above the flat portion of the film. The flexible display film may represent the interior surface of the container, or may be included as a separate film from another film that represents the interior surface of the container.

Figure 6:
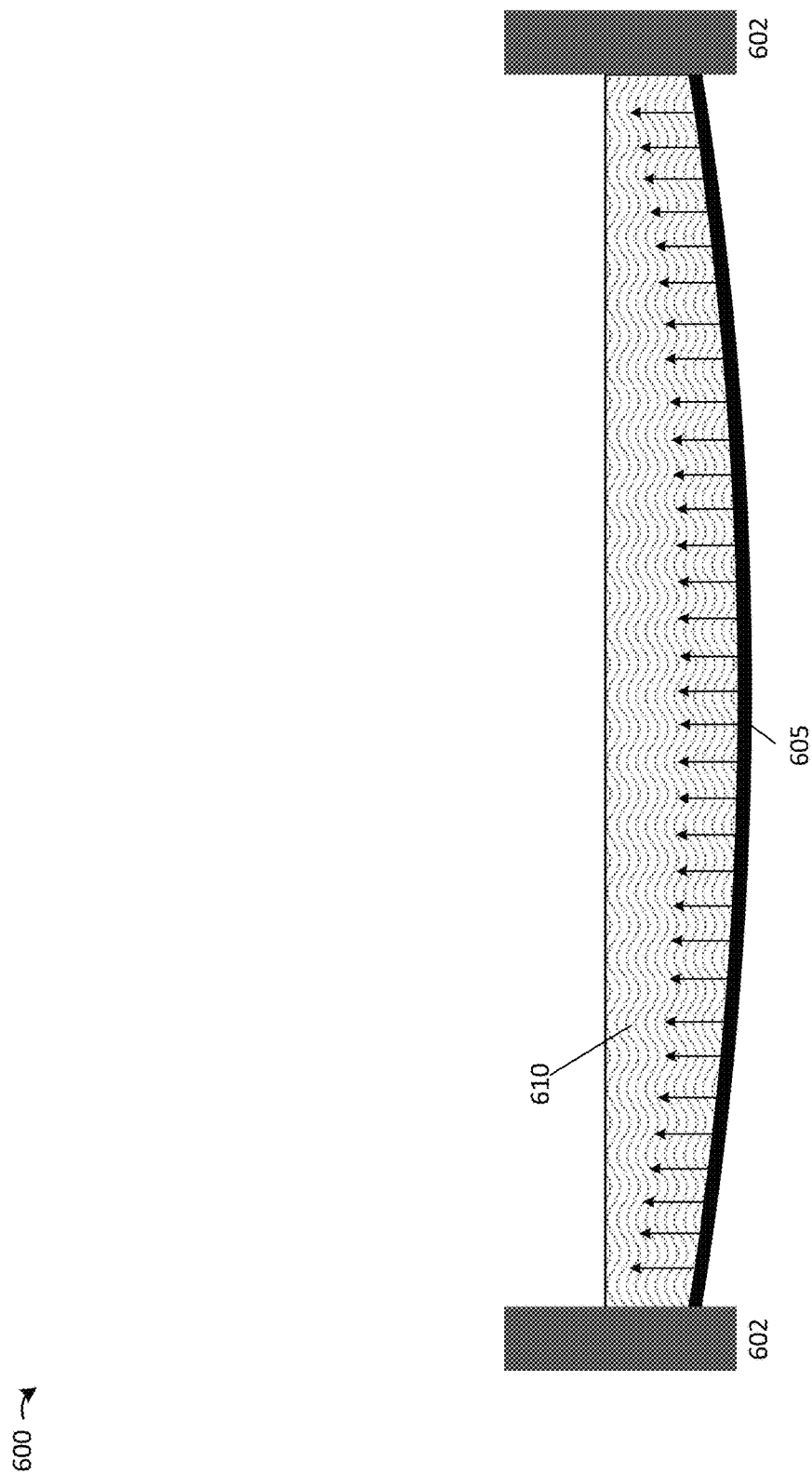
FIG. 6 depicts a container for an SLA device that includes a flexible display film, according to some embodiments.

For instance, FIG. 6 depicts a container for an SLA device that includes a flexible display film, according to some embodiments. Container 600, shown holding a liquid photopolymer 610 for purposes of illustration, includes a flexible display film 605 suspended and extending across sides of the container 602. The amount of sag in film 605 is exaggerated in FIG. 6, and may not be so large in practice. The flexible display film 605 may be arranged to produce light toward the interior of the container as represented in FIG. 6 by the vertical arrows. During operation, portions of the film 605 may be pushed upward to produce a flat portion of the film (e.g., by rollers or sliders that move across the underside of the film, or by a plate that extends across the container) and selected pixels within the flat portion illuminated to cure regions of the liquid photopolymer 610 at the bottom of the container.

In some embodiments, container 600 may include an additional film arranged below the flexible display film 605. This additional film may protect the flexible display film from scratches or other damage that might occur due to other components of an additive fabrication device (e.g., a movable stage) contacting the flexible display film.

According to some embodiments, an additive fabrication device that includes container 600 may be configured to direct light through the film 605, separately from the light produced from the flexible display film 605. The use of multiple light sources may provide flexibility in how a layer of material is cured. For instance, a layer of material may be cured by directing a source of light, such as a laser, from beneath the container 600 to cure a perimeter of an area, and cure the interior area of the perimeter by illuminating appropriate portions of the flexible display film 605. This approach may provide for fine detail at the visible edges of a part by using the laser (e.g., as illustrated in FIGS. 1-5 and the related description), while quickly filling in the (non-visible) interior of the part at a lower detail level using the display film. The curing of the perimeter by the separate light source and the curing of the interior by the flexible display film 605 may happen simultaneously or sequentially. The power of the laser and the display film may be adjusted so the perimeter and the interior finish curing simultaneously.

Figure 7A:
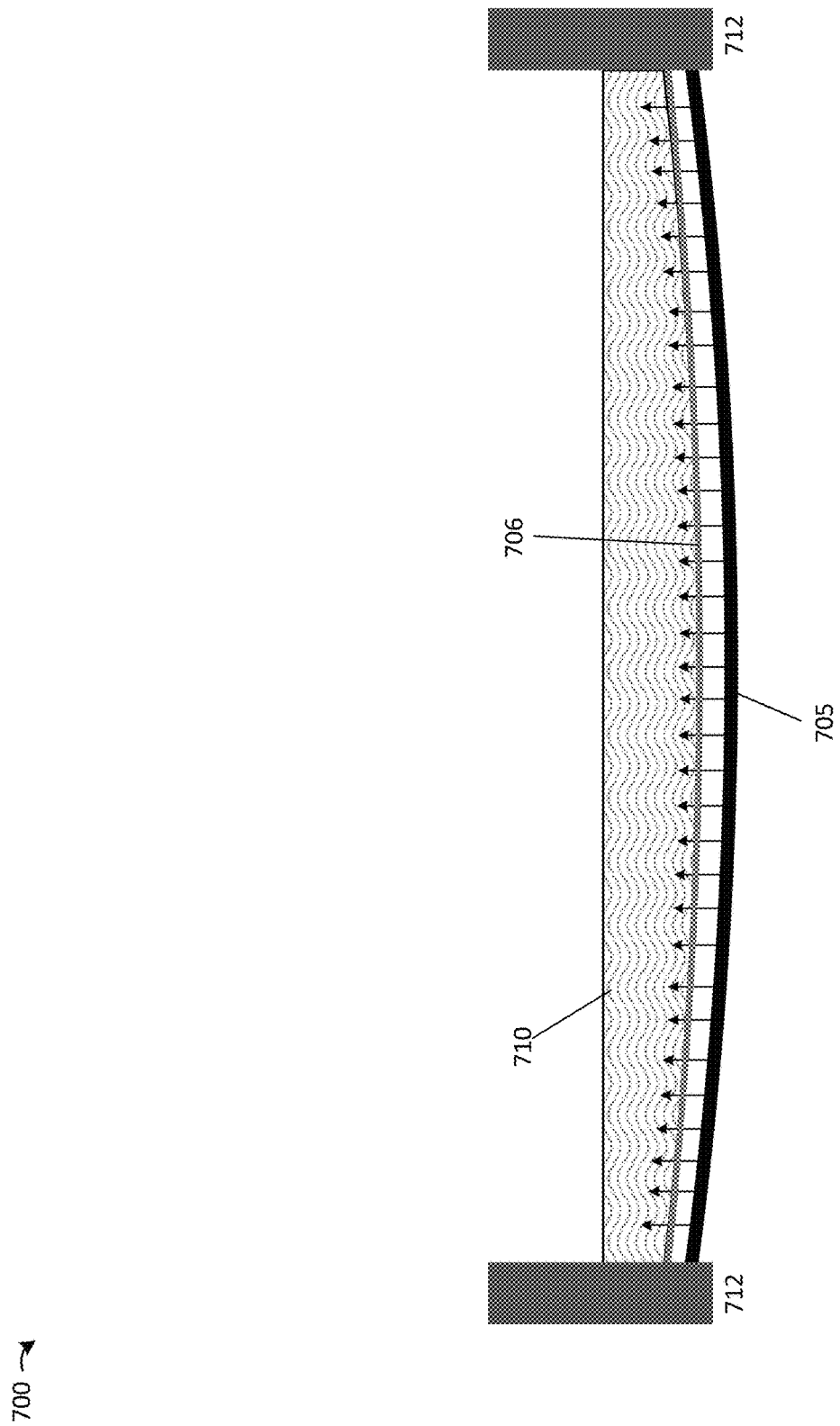
FIGS. 7A-7D depict illustrative containers for an SLA device that includes a flexible display film, according to some embodiments.

Alternatively, FIG. 7A depicts a container for an SLA device that includes a flexible display film in addition to another film, according to some embodiments. Container 700, shown holding a liquid photopolymer 710 for purposes of illustration, includes a flexible display film 705 suspended and extending across sides of the container 702 in addition to film 706 which is also suspended and extending across the sides, and is not attached to film 705 between the sides. The amount of sag in film 705 is exaggerated in FIG. 7A, and may not be so large in practice. The flexible display film 705 may be arranged to produce light toward the interior of the container as represented in FIG. 7A by the vertical arrows. During operation, portions of the film 705 may be pushed upward to produce a flat portion of the film (e.g., by rollers or sliders that move across the underside of the film, or by a plate that extends across the container) and selected pixels within the flat portion illuminated to cure regions of the liquid photopolymer 710 at the bottom of the container.

In some embodiments, film 705 comprises, or is comprised of, PMP. In some embodiments, film 705 may have a thickness of greater than or equal to 0.001", 0.002", 0.004". In some embodiments, film 705 may have a thickness of less than or equal 0.015", 0.010", 0.008". Any suitable combinations of the above-referenced ranges are also possible (e.g., a thickness of greater or equal to 0.002" and less than or equal to 0.008", etc.).

In some embodiments, container 700 may include an additional film arranged below the flexible display film 705 (not shown in FIG. 7A). This additional film may protect the flexible display film from scratches or other damage that might occur due to other components of an additive fabrication device (e.g., a movable stage) contacting the flexible display film.

According to some embodiments, an additive fabrication device that includes container 700 may be configured to direct light through the films 705 and 706, separately from the light produced from the flexible display film 705. The use of multiple light sources may provide flexibility in how a layer of material is cured. For instance, a layer of material may be cured by directing a source of light, such as a laser, from beneath the container 700 to cure a perimeter of an area, and cured the interior area of the perimeter by illuminating appropriate portions of the flexible display film 705. This approach may provide for fine detail at the visible edges of a part by using the laser, while quickly filling in the (non-visible) interior of the part at a lower detail level using the display film.

Figure 7B:
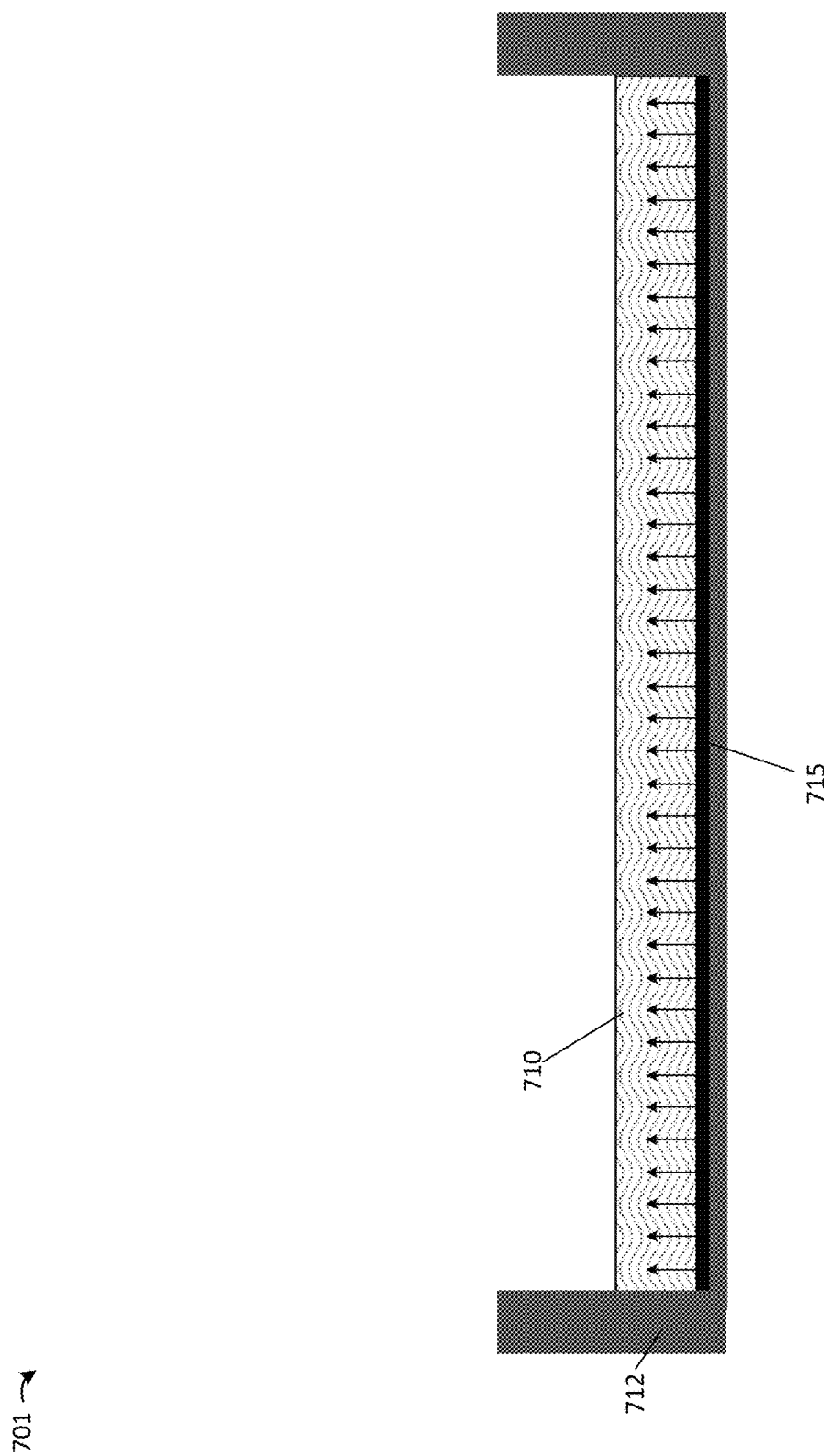

As an alternative to FIG. 7A, a container 701 may include a rigid base in addition to a flexible display film, as shown in FIG. 7B. In the example of FIG. 7B, the container 701 includes a flexible display film 715 arranged within and attached to the interior of a rigid body 712. The flexible display film 715 may be arranged to produce light toward the interior of the container 701 as represented in FIG. 7B by the vertical arrows. In some embodiments, the flexible display film 715 may aid in separating a part from the surface of the container 701 by allowing a cured layer of material to be pulled upwards relative to the container 701 (e.g., with the build platform) and to peel from the flexible display film 715 as a result of the upward pulling force applied to the layer. The container 701 may be removably insertable into an additive fabrication device such that the entire unit can be replaced with another such container.

Figure 7C:
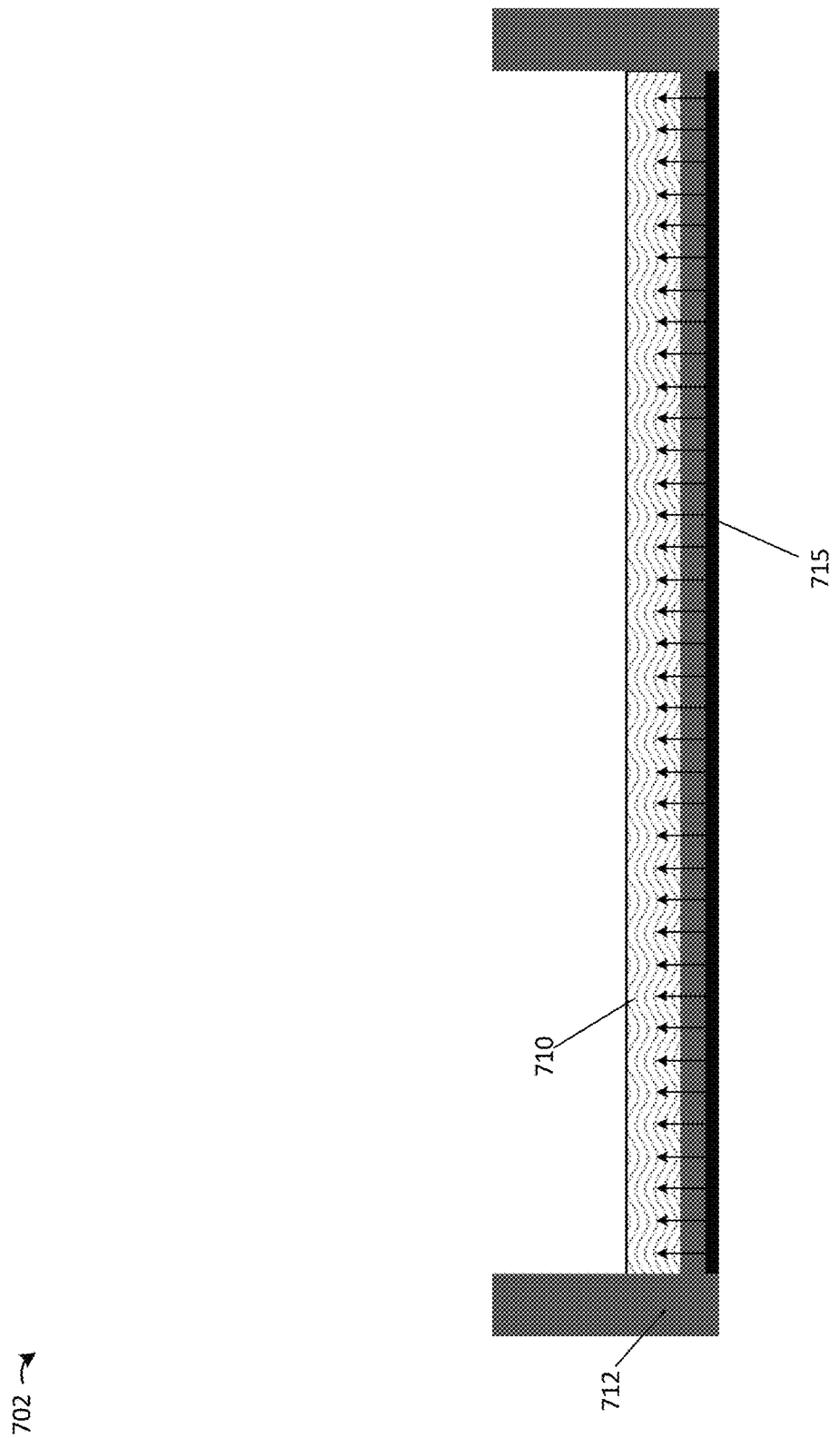

As an alternative to FIG. 7B, a container 701 may include a rigid base in addition to a flexible display film attached to the underside of a rigid body, as shown in FIG. 7C. In the example of FIG. 7C, the container 702 includes a flexible display film 715 arranged within and attached to the interior of a rigid body 712. The flexible display film 715 may be arranged to produce light through the bottom of the container and toward the interior of the container 702 as represented in FIG. 7C by the vertical arrows. The container 701 may be removably insertable into an additive fabrication device such that the entire unit can be replaced with another such container. In some embodiments, container 702 may include an additional film arranged below the flexible display film 715. This additional film may protect the flexible display film 715 from scratches or other damage that might occur due to other components of an additive fabrication device (e.g., a movable stage) contacting the flexible display film.

Figure 7D:
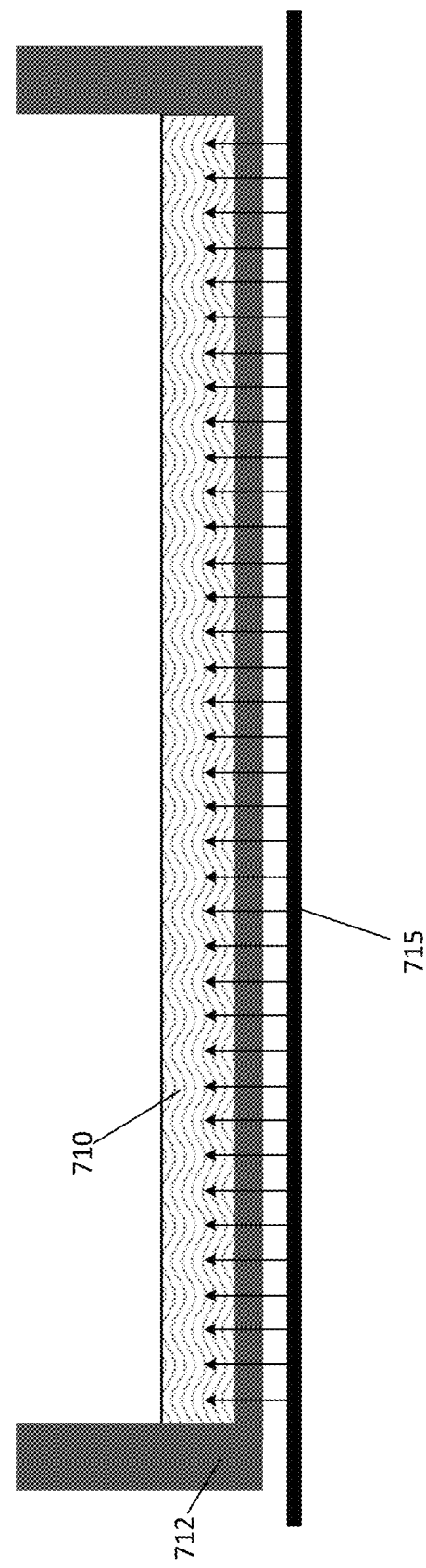

As an alternative to FIG. 7C, an additive fabrication device may include a rigid container configured to be arranged over a flexible display film, as shown in FIG. 7D. In the example of FIG. 7D, an additive fabrication device includes a flexible display film 715 arranged beneath a rigid container 712 with a transparent bottom (e.g., transparent to light emitted from the flexible display film 715). The flexible display film 715 may be arranged to produce light through the bottom of the container and toward the interior of the container 712 as represented in FIG. 7D by the vertical arrows. The container 712 may be removed from the additive fabrication device.

Figure 8:
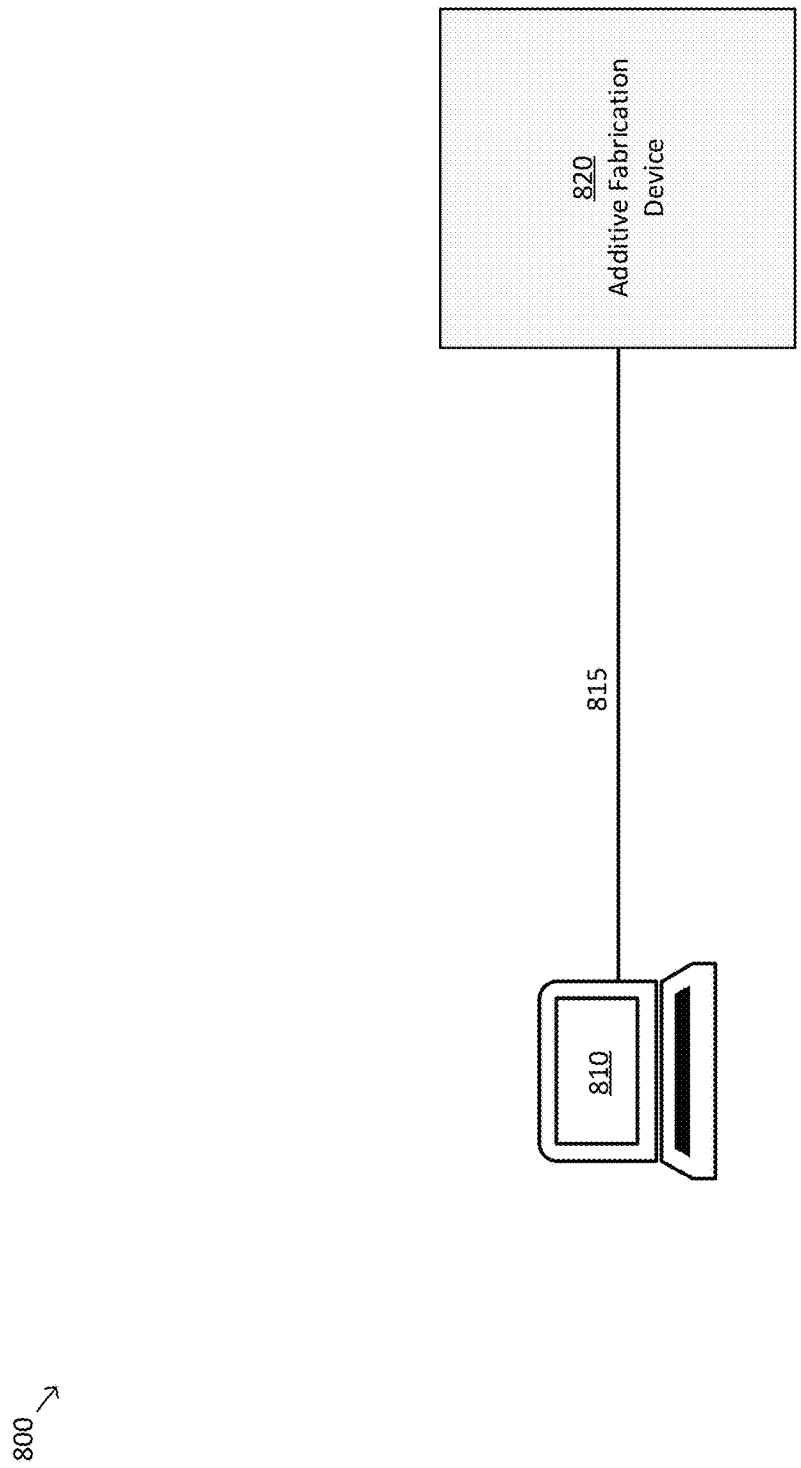
FIG. 8 is a block diagram of a system suitable for practicing aspects of the invention, according to some embodiments.

FIG. 8 is a block diagram of a system suitable for practicing aspects of the invention, according to some embodiments. System 800 illustrates a system suitable for generating instructions to perform additive fabrication by an additive fabrication device and subsequent operation of the additive fabrication device to fabricate a part. For instance, instructions to adjust a focal length of a variable focus lens while directing light into a build region to fabricate a part as described above may be generated by the system and provided to the additive fabrication device. Various parameters associated with a variable focus lens and the adjustment thereof may be stored by computer system 810 and accessed when generating instructions for the additive fabrication device 820.

According to some embodiments, computer system 810 may execute software that generates instructions for fabricating a part using an additive fabrication device. Said instructions may then be provided to an additive fabrication device, such as additive fabrication device 820, via link 815, which may comprise any suitable wired and/or wireless communications connection. In some embodiments, a single housing holds the computing device 810 and additive fabrication device 820 such that the link 815 is an internal link connecting two modules within the housing of system 800.

Figure 9:
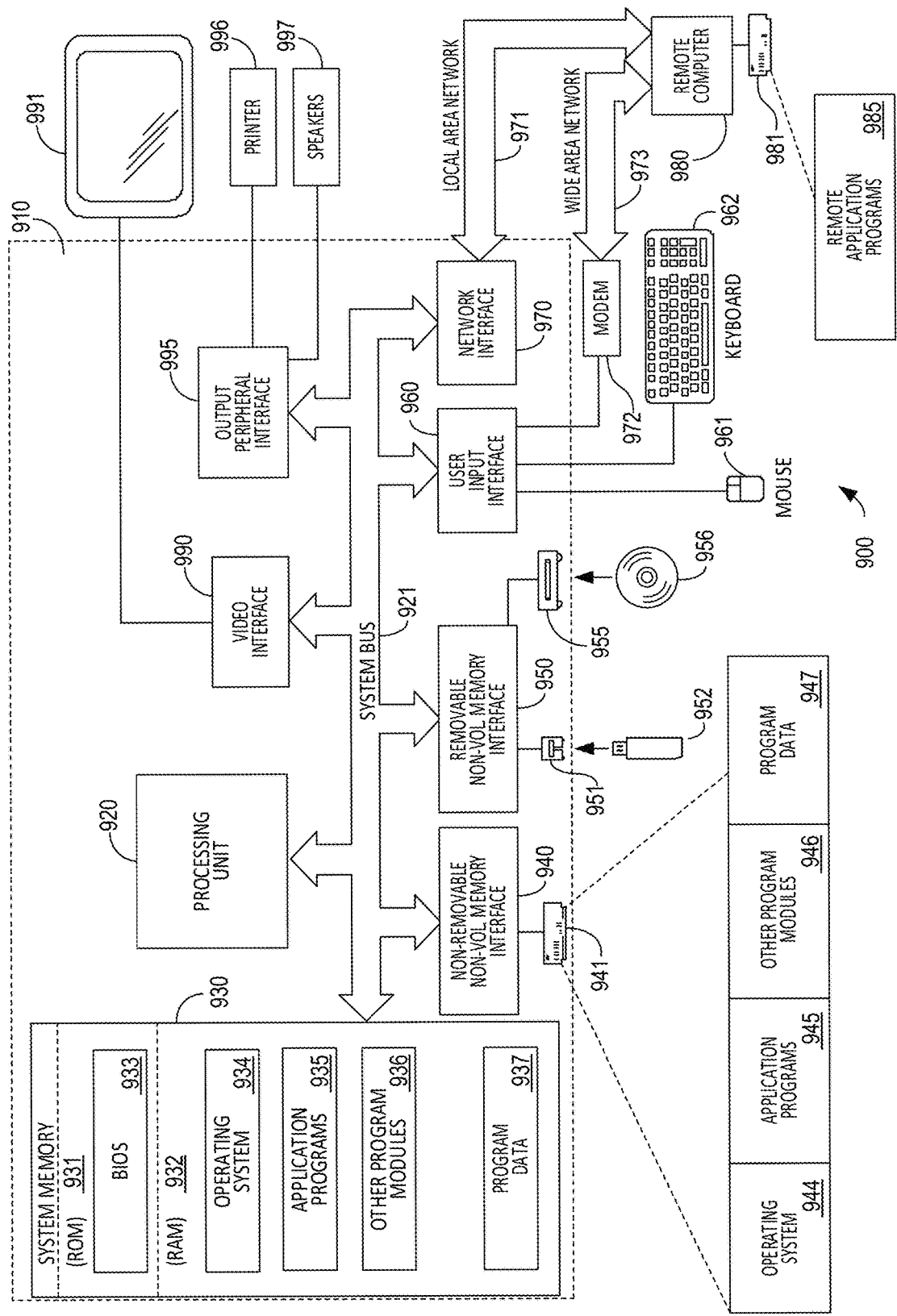
FIG. 9 illustrates an example of a computing system environment on which aspects of the invention may be implemented.

FIG. 9 illustrates an example of a suitable computing system environment 900 on which the technology described herein may be implemented. For example, computing environment 900 may form some or all of the computer system 810 shown in FIG. 8. The computing system environment 900 is only one example of a suitable computing environment and is not intended to suggest any limitation as to the scope of use or functionality of the technology described herein. Neither should the computing environment 900 be interpreted as having any dependency or requirement relating to any one or combination of components illustrated in the exemplary operating environment 900.

The technology described herein is operational with numerous other general purpose or special purpose computing system environments or configurations. Examples of well-known computing systems, environments, and/or configurations that may be suitable for use with the technology described herein include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The technology described herein may also be practiced in distributed computing environments where tasks are performed by remote processing devices that are linked through a communications network. In a distributed computing environment, program modules may be located in both local and remote computer storage media including memory storage devices.

With reference to FIG. 9, an exemplary system for implementing the technology described herein includes a general purpose computing device in the form of a computer 910. Components of computer 910 may include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 910 typically includes a variety of computer readable media. Computer readable media can be any available media that can be accessed by computer 910 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 910. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 930 includes computer storage media in the form of volatile and/or nonvolatile memory such as read only memory (ROM) 931 and random access memory (RAM) 932. A basic input/output system 933 (BIOS), containing the basic routines that help to transfer information between elements within computer 910, such as during start-up, is typically stored in ROM 931. RAM 932 typically contains data and/or program modules that are immediately accessible to and/or presently being operated on by processing unit 920. By way of example, and not limitation, FIG. 9 illustrates operating system 934, application programs 935, other program modules 936, and program data 937.

The computer 910 may also include other removable/non-removable, volatile/nonvolatile computer storage media. By way of example only, FIG. 9 illustrates a hard disk drive 941 that reads from or writes to non-removable, nonvolatile magnetic media, a flash drive 951 that reads from or writes to a removable, nonvolatile memory 952 such as flash memory, and an optical disk drive 955 that reads from or writes to a removable, nonvolatile optical disk 956 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 941 is typically connected to the system bus 921 through a non-removable memory interface such as interface 940, and magnetic disk drive 951 and optical disk drive 955 are typically connected to the system bus 921 by a removable memory interface, such as interface 950.

The drives and their associated computer storage media discussed above and illustrated in FIG. 9, provide storage of computer readable instructions, data structures, program modules and other data for the computer 910. In FIG. 9, for example, hard disk drive 941 is illustrated as storing operating system 944, application programs 945, other program modules 946, and program data 947. Note that these components can either be the same as or different from operating system 934, application programs 935, other program modules 936, and program data 937. Operating system 944, application programs 945, other program modules 946, and program data 947 are given different numbers here to illustrate that, at a minimum, they are different copies. A user may enter commands and information into the computer 910 through input devices such as a keyboard 962 and pointing device 961, commonly referred to as a mouse, trackball or touch pad. Other input devices (not shown) may include a microphone, joystick, game pad, satellite dish, scanner, or the like. These and other input devices are often connected to the processing unit 920 through a user input interface 960 that is coupled to the system bus, but may be connected by other interface and bus structures, such as a parallel port, game port or a universal serial bus (USB). A monitor 991 or other type of display device is also connected to the system bus 921 via an interface, such as a video interface 990. In addition to the monitor, computers may also include other peripheral output devices such as speakers 997 and printer 996, which may be connected through an output peripheral interface 995.

The computer 910 may operate in a networked environment using logical connections to one or more remote computers, such as a remote computer 980. The remote computer 980 may be a personal computer, a server, a router, a network PC, a peer device or other common network node, and typically includes many or all of the elements described above relative to the computer 910, although only a memory storage device 981 has been illustrated in FIG. 9. The logical connections depicted in FIG. 9 include a local area network (LAN) 971 and a wide area network (WAN) 973, but may also include other networks. Such networking environments are commonplace in offices, enterprise-wide computer networks, intranets and the Internet.

When used in a LAN networking environment, the computer 910 is connected to the LAN 971 through a network interface or adapter 970. When used in a WAN networking environment, the computer 910 typically includes a modem 972 or other means for establishing communications over the WAN 973, such as the Internet. The modem 972, which may be internal or external, may be connected to the system bus 921 via the user input interface 960, or other appropriate mechanism. In a networked environment, program modules depicted relative to the computer 910, or portions thereof, may be stored in the remote memory storage device. By way of example, and not limitation, FIG. 9 illustrates remote application programs 985 as residing on memory device 981. It will be appreciated that the network connections shown are exemplary and other means of establishing a communications link between the computers may be used.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. However, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a non-transitory computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software," when used herein, are used in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An additive fabrication device comprising:
   a build platform with a build surface for forming an object thereon, wherein the build platform is configured to move in a vertical direction relative to the additive fabrication device;
   a container for holding liquid photopolymer that is polymerizable on exposure to radiation, the container comprising:
   an interior bottom surface;
   sides connected to the interior bottom surface; and
   a flexible display film extended between the sides of the container, wherein the flexible display film is configured to produce radiation to cure selected portions of the liquid photopolymer in the container, and
   at least one controller configured to operate the flexible display film as a light source to produce said radiation from selected regions of the flexible display film to cure the selected portions of the liquid photopolymer and thereby form a layer of cured liquid photopolymer in contact with the interior bottom surface of the container and the build surface of the build platform and/or a previously formed layer of cured liquid photopolymer.

2. The additive fabrication device of claim 1, wherein the flexible display film forms at least part of the interior bottom surface of the container.

3. The additive fabrication device of claim 1, wherein the container further comprises a first film extended between the sides of the container, and wherein the first film forms at least part of the interior bottom surface of the container.

4. The additive fabrication device of claim 1, wherein the flexible display film is a flexible LCD display, a flexible OLED display, or a flexible micro-LED display.

5. The additive fabrication device of claim 1, wherein the flexible display film is configured to emit ultra-violet radiation or near-ultra-violet radiation.

6. The additive fabrication device of claim 1, wherein the additive fabrication device further comprises a movable stage configured to move in a lateral direction relative to the additive fabrication device underneath the container.

7. The additive fabrication device of claim 6, wherein the movable stage is configured to contact the flexible display film and produce a flat portion of the flexible display film above the movable stage.

8. The additive fabrication device of claim 6, wherein the movable stage comprises a plurality of lasers configured to produce radiation to cure the liquid photopolymer in the container, and wherein the flexible display film is transparent to the radiation produced by the plurality of lasers.

9. The additive fabrication device of claim 8, wherein the plurality of lasers are vertical-cavity surface emitting lasers (VCSELs).

10. The additive fabrication device of claim 8, wherein the plurality of lasers are configured to emit ultraviolet light.

11. The additive fabrication device of claim 8, wherein the plurality of lasers are configured to emit infrared light.

12. The additive fabrication device of claim 8, wherein the plurality of lasers are arranged in a single row.

13. The additive fabrication device of claim 8, wherein the plurality of lasers are arranged in a two-dimensional array.

14. The additive fabrication device of claim 8, wherein the plurality of lasers and the flexible display film are configured to cure different portions of the liquid photopolymer simultaneously.

15. The additive fabrication device of claim 8, further comprising a variable focal length lens situated between the plurality of lasers and the interior bottom surface of the container, wherein the variable focal length lens is configured to adjust a focal length according to a selected plurality of different spot sizes.

* * * * *